(12) United States Patent
Courtney et al.

(10) Patent No.: US 11,270,983 B2
(45) Date of Patent: Mar. 8, 2022

(54) SYSTEM AND METHOD FOR PROVIDING MECHANICAL ISOLATION OF ASSEMBLED DIODES

(71) Applicant: Semtech Corporation, Camarillo, CA (US)

(72) Inventors: David Francis Courtney, McAllen, TX (US); Angel Mario Cano Garza, Monterrey (MX)

(73) Assignee: SEMTECH CORPORATION, Camarillo, CA (US)

( * ) Notice: Subject to any disclaimer, the term of this patent is extended or adjusted under 35 U.S.C. 154(b) by 106 days.

(21) Appl. No.: 16/601,150

(22) Filed: Oct. 14, 2019

(65) Prior Publication Data

US 2020/0118981 A1   Apr. 16, 2020

Related U.S. Application Data

(60) Provisional application No. 62/745,913, filed on Oct. 15, 2018.

(51) Int. Cl.
*H01L 21/02* (2006.01)
*H01L 25/07* (2006.01)
*H01L 23/14* (2006.01)

(52) U.S. Cl.
CPC .......... *H01L 25/072* (2013.01); *H01L 23/14* (2013.01)

(58) Field of Classification Search
CPC combination set(s) only.
See application file for complete search history.

(56) References Cited

U.S. PATENT DOCUMENTS

| 3,234,437 A * | 2/1966 | Dumas ................. H01L 23/051 |
| | | 257/688 |
| 5,206,455 A | 4/1993 | Williams et al. |
| 5,227,942 A | 7/1993 | Rourk |
| 5,446,314 A * | 8/1995 | Melnick ............... H01L 25/071 |
| | | 257/678 |

(Continued)

FOREIGN PATENT DOCUMENTS

| EP | 1014451 | 6/2000 |
| EP | 1014451 A1 * | 6/2000 ........... H01L 25/112 |

(Continued)

OTHER PUBLICATIONS www.dictionary.com/browse/adjacent (publishers 1998, 2000, 2003, 2005, 2006, 2007, 2009, 2012).*

(Continued)

*Primary Examiner* — Niki H Nguyen
(74) *Attorney, Agent, or Firm* — Jackson Walker LLP; Christopher J. Rourk

(57) ABSTRACT

A circuit, comprising a diode, a conductive upper support disposed on top of the diode and electrically coupled to the diode, a conductive lower support disposed underneath the diode and electrically coupled to the diode, a mechanical support disposed adjacent to the diode, the conductive upper support and the conductive lower support, an insulator disposed underneath the mechanical support, an upper terminal coupled to the mechanical support and electrically coupled to the conductive upper support and a lower terminal coupled to the insulator and electrically coupled to the conductive lower support.

20 Claims, 1 Drawing Sheet

(56) References Cited

U.S. PATENT DOCUMENTS

| | | | |
|---|---|---|---|
| 5,726,466 A * | 3/1998 | Nishitani | H01L 23/051 |
| | | | 257/181 |
| 6,122,232 A | 9/2000 | Schell et al. | |
| 8,552,299 B2 | 10/2013 | Rogers et al. | |
| 9,601,671 B2 | 3/2017 | Rogers et al. | |
| 2003/0201462 A1 | 10/2003 | Pommer et al. | |
| 2006/0204741 A1* | 9/2006 | Rehbein | H01R 13/035 |
| | | | 428/304.4 |
| 2008/0135095 A1 | 6/2008 | Cummings et al. | |
| 2012/0157804 A1 | 6/2012 | Rogers et al. | |
| 2015/0102481 A1 | 4/2015 | Steinhoff et al. | |
| 2016/0126157 A1 | 5/2016 | Jeon | |
| 2017/0154855 A1* | 6/2017 | Oi | H01L 23/051 |
| 2017/0301606 A1 | 10/2017 | Ko | |

FOREIGN PATENT DOCUMENTS

| | | |
|---|---|---|
| JP | 2003258139 | 9/2003 |
| JP | 2003258139 A * | 9/2003 |
| JP | 2018011020 | 1/2018 |
| KR | 101870690 B1 | 6/2018 |
| WO | 2002093696 A2 | 11/2002 |
| WO | 2010042981 A1 | 4/2010 |

OTHER PUBLICATIONS

Notification of Transmittal of the International Search Report and Written Opinion of the International Search Authority—The European Patent Office—dated Jan. 3, 2020 for PCT/US19/056109, 15 pages.

* cited by examiner

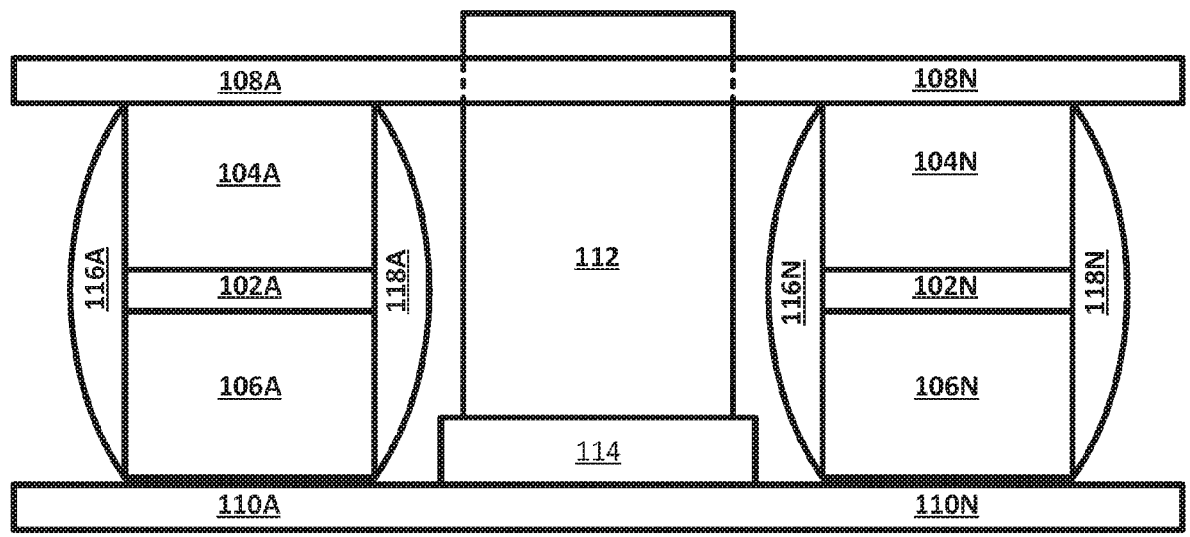
FIGURE 1    100
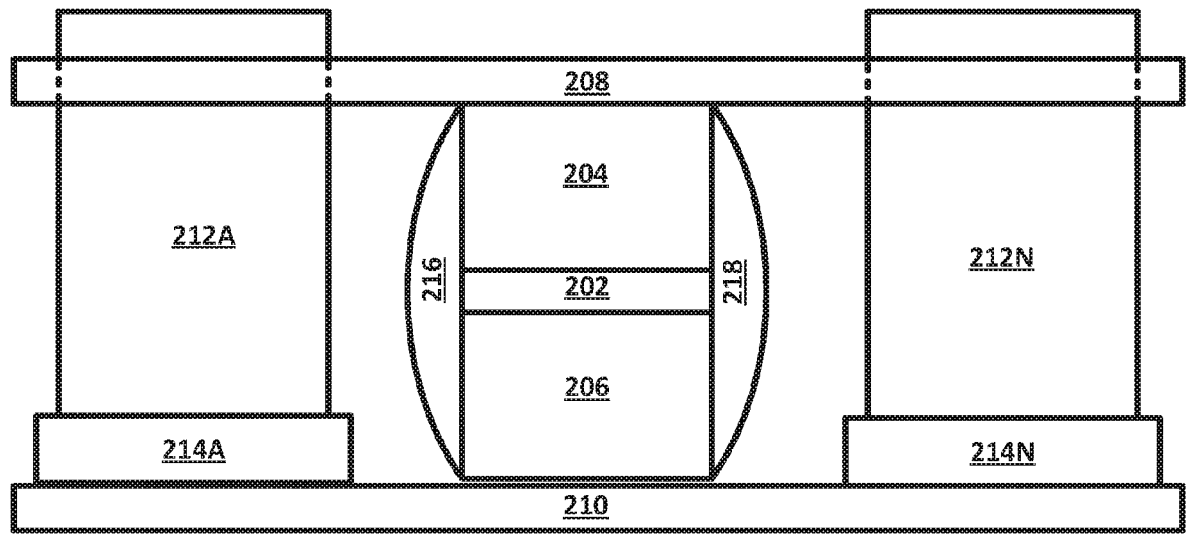
FIGURE 2    200

SYSTEM AND METHOD FOR PROVIDING MECHANICAL ISOLATION OF ASSEMBLED DIODES

RELATED APPLICATIONS

The present application claims priority to and benefit of U.S. Provisional Patent Application No. 62/745,913, filed Oct. 15, 2018, which is hereby incorporated by reference for all purposes as if set forth herein in its entirety.

TECHNICAL FIELD

The present disclosure relates generally to diodes, and more specifically to a diode support structure for providing mechanical isolation.

BACKGROUND OF THE INVENTION

Diodes can be used in applications that result in significant damaging stress, and will be damaged without adequate protection.

SUMMARY OF THE INVENTION

A circuit is disclosed that includes a diode, a conductive upper support disposed on top of the diode and electrically coupled to the diode and a conductive lower support disposed underneath the diode and electrically coupled to the diode. A mechanical support is disposed adjacent to the diode, the conductive upper support and the conductive lower support, and an insulator disposed underneath the mechanical support. In combination, the mechanical support and insulator protect the diode from mechanical stress. An upper terminal is coupled to the mechanical support and electrically coupled to the conductive upper support and a lower terminal is coupled to the insulator and electrically coupled to the conductive lower support.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings may be to scale, but emphasis is placed upon clearly illustrating the principles of the present disclosure. Moreover, in the drawings, like reference numerals designate corresponding parts throughout the several views, and in which:

FIG. 1 is a diagram of a single support structure for providing mechanical isolation of assembled diodes, in accordance with an example embodiment of the present disclosure; and FIG. 2 is a diagram of a multiple support structure for providing mechanical isolation of assembled diodes, in accordance with an example embodiment of the present disclosure.

DETAILED DESCRIPTION OF THE INVENTION

In the description that follows, like parts are marked throughout the specification and drawings with the same reference numerals. The drawing figures may be to scale and certain components can be shown in generalized or schematic form and identified by commercial designations in the interest of clarity and conciseness.

Diodes can be subjected to high mechanical forces in certain applications, such as when they are installed on mechanical equipment or vehicles where such stresses can be imposed by external conditions or use. If these mechanical forces reach the silicon die, then damage to the diode can occur, resulting in failure. The present disclosure isolates the diodes from these forces by using a mechanical stress isolator to protect the diodes from mechanical stresses.

In one example embodiment, an insulating material can be provided that surrounds the diode structure. The diode structure can include a conductive base such as aluminum, magnesium, tungsten, titanium, beryllium, other suitable metals or alloys of such metals, on either side of the silicon die. Electrical isolation of the anode and cathode can be provided by a ceramic disc or other suitable structures that have insulating band gaps and structural stability and strength.

A top terminal of the assembly can be recessed from the center post to avoid contact with an axis of stress, and can be thin enough to provide flexibility and to reduce the potential for imparting mechanical stresses. Likewise, other suitable configurations for distributing stress can also or alternatively be used, such as multiple posts, posts on either side of the diode structure and so forth.

The base, top flange and metal post can be made from C10100 copper, C10200 copper or other suitable materials, and can be silver plated with gold and nickel under plate or otherwise treated. The ceramic can be aluminum nitride that is metalized with MnO2 followed by Ni and then gold on both sides or other suitable ceramics. The diodes can be made from tungsten headers silver brazed to a silicon chip and then be sealed in a zinc borosilicate glass, or other suitable materials. The top surfaces of the diodes can be brazed copper or other suitable materials. Gold/tin eutectic solder or other suitable materials can then be used to fasten the components together.

FIG. 1 is a diagram of a single support structure 100 for providing mechanical isolation of assembled diodes, in accordance with an example embodiment of the present disclosure. Single support structure 100 includes diodes 102A through 102N, conductive bases 106A through 106N, conductive terminals 104A through 104N, upper terminals 108A through 108N, lower terminals 110A through 110N, center post 112 and insulator 114, which can be fabricated from suitable materials as discussed in greater detail below. In the disclosed embodiments, N can be a suitable positive integer, where the annotation "A" through "N" indicates a suitable number of items, such as two or more.

Diodes 102A through 102N can be oriented with cathodes on top and anodes on bottom or anodes on top and cathodes on bottom, as needed. Diodes 102A through 102N can be fabricated with tungsten headers that are silver brazed to a silicon diode chip, a gallium arsenide diode chip or other suitable diode chips, and can then be sealed in a zinc borosilicate glass 116A/118A through 116N/118N or other suitable materials. The top surfaces of diodes 102A through 102N can be brazed copper or other suitable materials.

Conductive bases 106A through 106N can be fabricated from aluminum, magnesium, tungsten, titanium, beryllium, other suitable metals or alloys of such metals, and provide a conductive path for current to flow through diodes 102A through 102N, respectively. Contact to the associated diode 102A though 102N can be made by placing the diode 102A through 102N in contact with conductive base 106A though 106N, respectively, by use of gold/tin eutectic solder, a conductive material or in other suitable manners. The surface of conductive bases 106A though 106N can be prepared as needed to improve contact.

Conductive terminals 104A through 104N can be fabricated from aluminum, magnesium, tungsten, titanium, beryllium, other suitable metals or alloys of such metals, and provide a conductive path for current to flow through diodes 102A through 102N, respectively. The material of conductive terminals 104A through 104N can be matched to the material of conductive bases 106A through 106N, different materials can be used where suitable, or other suitable combinations of materials can be used. Contact to the associated diode 102A though 102N can be made by placing the diode 102A through 102N in contact with conductive terminals 104A though 104N, respectively, by use of gold/tin eutectic solder, a conductive material or in other suitable manners. The surface of conductive terminals 104A though 104N can be prepared as needed to improve contact.

Upper terminals 108A through 108N can be fabricated from C10100 copper, C10200 copper or other suitable materials, can be silver plated with gold and nickel under plate, or other suitable configurations can also or alternatively be used. One or more of terminals 108A though 108N can be recessed from center post 112 to avoid contact with an axis of stress, and can be thin enough to provide flexibility and to reduce the potential for imparting mechanical stresses. In another example embodiment, upper terminals 108A through 108N can be formed from a single piece, and can be disposed in a penetration through center post 112, can be disposed around center post 112, or can have other suitable configurations. Likewise, other suitable configurations for distributing stress can also or alternatively be used.

Lower terminals 110A through 110N can be fabricated from C10100 copper, C10200 copper or other suitable materials, can be silver plated with gold and nickel under plate, or other suitable configurations can also or alternatively be used. The material of lower terminals 110A through 110N can be matched to the material of upper terminals 108A through 108N, different materials can be used where suitable, or other suitable combinations of materials can be used. One or more of lower terminals 110A though 110N can be recessed from center post 112 to avoid contact with an axis of stress, and can be thin enough to provide flexibility and to reduce the potential for imparting mechanical stresses, if suitable. Likewise, other suitable configurations for distributing stress can also or alternatively be used.

Center post 112 can be fabricated from C10100 copper, C10200 copper or other suitable materials, can be silver plated with gold and nickel under plate, or other suitable configurations can also or alternatively be used.

Insulator 114 can be fabricated from aluminum nitride that is metalized with MnO2, followed by Ni and then gold on both sides or other suitable ceramics. Insulator 114 prevents electrical current from bypassing diodes 102A through 102N, and also provides mechanical isolation to protect the mechanical integrity of diodes 102A through 102N.

In operation, single support structure 100 protects diodes 102A through 102N from mechanical stress, while allowinig diodes 102A through 102N to function as designed in an electrical circuit. Single support structure 100 can thus be used in applications where diodes can be exposed to damaging mechanical forces, to protect the diodes from such forces.

FIG. 2 is a diagram of a multiple support structure 200 for providing mechanical isolation of assembled diodes, in accordance with an example embodiment of the present disclosure. Multiple support structure 200 includes diode 202, conductive base 206, conductive terminal 204, upper terminal 208, lower terminal 210, side posts 212A through 212N and insulators 214A through 214N, which can be fabricated from suitable materials as discussed in greater detail below. In the disclosed embodiments, N can be a suitable positive integer, where the annotation "A" through "N" indicates a suitable number of items, such as two or more.

Diode 202 can be oriented with a cathode on top and anode on bottom or an anode on top and cathode on bottom, as needed. Diode 202 can be fabricated with tungsten headers that are silver brazed to a silicon diode chip, a gallium arsenide diode chip or other suitable diode chips, and can then be sealed in a zinc borosilicate glass 216/218 or other suitable materials. The top surface of diode 202 can be brazed copper or other suitable materials.

Conductive base 206 can be fabricated from aluminum, magnesium, tungsten, titanium, beryllium, other suitable metals or alloys of such metals, and provide a conductive path for current to flow through diode 202. Contact to the diode 202 can be made by placing diode 202 in contact with conductive base 206, by use of gold/tin eutectic solder, a conductive material or in other suitable manners. The surface of conductive base 206 can be prepared as needed to improve contact.

Conductive terminal 204 can be fabricated from aluminum, magnesium, tungsten, titanium, beryllium, other suitable metals or alloys of such metals, and provide a conductive path for current to flow through diode 202. The material of conductive terminal 204 can be matched to the material of conductive base 206, different materials can be used where suitable, or other suitable combinations of materials can be used. Contact to the diode 202 can be made by placing the diode 202 in contact with conductive terminals 204, by use of gold/tin eutectic solder, a conductive material or in other suitable manners. The surface of conductive terminal 204 can be prepared as needed to improve contact.

Upper terminal 208 can be fabricated from C10100 copper, C10200 copper or other suitable materials, can be silver plated with gold and nickel under plate, or other suitable configurations can also or alternatively be used. Terminal 208 can be recessed from side posts 212 to avoid contact with an axis of stress, and can be thin enough to provide flexibility and to reduce the potential for imparting mechanical stresses. Likewise, other suitable configurations for distributing stress can also or alternatively be used.

Lower terminal 210 can be fabricated from C10100 copper, C10200 copper or other suitable materials, can be silver plated with gold and nickel under plate, or other suitable configurations can also or alternatively be used. The material of lower terminal 210 can be matched to the material of upper terminal 208, different materials can be used where suitable, or other suitable combinations of materials can be used. Lower terminal 210 can be recessed from side posts 212A through 212N to avoid contact with an axis of stress, and can be thin enough to provide flexibility and to reduce the potential for imparting mechanical stresses, if suitable. Likewise, other suitable configurations for distributing stress can also or alternatively be used.

Side posts 212A through 212N can be fabricated from C10100 copper, C10200 copper or other suitable materials, can be silver plated with gold and nickel under plate, or other suitable configurations can also or alternatively be used.

Insulators 214A through 214N can be fabricated from aluminum nitride that is metalized with MnO2, followed by Ni and then gold on both sides or other suitable ceramics. Insulators 214A through 214N prevent electrical current from bypassing diode 202, and also provide mechanical isolation to protect the mechanical integrity of diode 202.

In operation, multiple support structure 200 protects diode 202 from mechanical stress, while allowing diodes 202 to function as designed in an electrical circuit. Multiple support structure 200 can thus be used in applications where diodes can be exposed to damaging mechanical forces, to protect the diodes from such forces.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes one or more microcomputers or other suitable data processing units, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections. The term "data" can refer to a suitable structure for using, conveying or storing data, such as a data field, a data buffer, a data message having the data value and sender/receiver address data, a control message having the data value and one or more operators that cause the receiving system or component to perform a function using the data, or other suitable hardware or software components for the electronic processing of data.

In general, a software system is a system that operates on a processor to perform predetermined functions in response to predetermined data fields. For example, a system can be defined by the function it performs and the data fields that it performs the function on. As used herein, a NAME system, where NAME is typically the name of the general function that is performed by the system, refers to a software system that is configured to operate on a processor and to perform the disclosed function on the disclosed data fields. Unless a specific algorithm is disclosed, then any suitable algorithm that would be known to one of skill in the art for performing the function using the associated data fields is contemplated as falling within the scope of the disclosure. For example, a message system that generates a message that includes a sender address field, a recipient address field and a message field would encompass software operating on a processor that can obtain the sender address field, recipient address field and message field from a suitable system or device of the processor, such as a buffer device or buffer system, can assemble the sender address field, recipient address field and message field into a suitable electronic message format (such as an electronic mail message, a TCP/IP message or any other suitable message format that has a sender address field, a recipient address field and message field), and can transmit the electronic message using electronic messaging systems and devices of the processor over a communications medium, such as a network. One of ordinary skill in the art would be able to provide the specific coding for a specific application based on the foregoing disclosure, which is intended to set forth exemplary embodiments of the present disclosure, and not to provide a tutorial for someone having less than ordinary skill in the art, such as someone who is unfamiliar with programming or processors in a suitable programming language. A specific algorithm for performing a function can be provided in a flow chart form or in other suitable formats, where the data fields and associated functions can be set forth in an exemplary order of operations, where the order can be rearranged as suitable and is not intended to be limiting unless explicitly stated to be limiting.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A circuit, comprising:
    a diode;
    a conductive upper support disposed on top of the diode and electrically coupled to the diode;
    a conductive lower support disposed underneath the diode and electrically coupled to the diode;
    a mechanical support disposed adjacent to the diode, the conductive upper support and the conductive lower support;
    an insulator disposed underneath the mechanical support;
    an upper terminal coupled to the mechanical support and electrically coupled to the conductive upper support;
    a lower terminal coupled to the insulator and electrically coupled to the conductive lower support, and wherein the diode is sealed in a glass material.

2. The circuit of claim 1 further comprising a second diode disposed adjacent to the mechanical support.

3. The circuit of claim 2 further comprising a second conductive upper support disposed on top of the second diode and electrically coupled to the second diode.

4. The circuit of claim 3 further comprising a second conductive lower support disposed underneath the second diode and electrically coupled to the second diode.

5. The circuit of claim 4 wherein the upper terminal is electrically coupled to the second conductive upper support.

6. The circuit of claim 5 wherein the lower terminal is electrically coupled to the second conductive lower support.

7. The circuit of claim 1 further comprising a second mechanical support disposed adjacent to the diode, the conductive upper support and the conductive lower support.

8. The circuit of claim 7 further comprising a second insulator disposed underneath the second mechanical support.

9. The circuit of claim 7 wherein the upper terminal is coupled to the second mechanical support and electrically coupled to the conductive upper support.

10. The circuit of claim 8 wherein the lower terminal is coupled to the second insulator and electrically coupled to the conductive lower support.

11. The circuit of claim 1 wherein the diode is fabricated from silicon or germanium.

12. The circuit of claim 1 wherein the conductive upper support is fabricated from aluminum, magnesium, tungsten, titanium or beryllium.

13. The circuit of claim 1 wherein the conductive lower support is fabricated from aluminum, magnesium, tungsten, titanium or beryllium.

14. The circuit of claim 1 wherein the mechanical support is fabricated from C10100 copper or C10200 copper.

15. The circuit of claim 1 wherein the insulator is fabricated from aluminum nitride.

16. The circuit of claim 1 wherein the upper terminal coupled is fabricated from C10100 copper or C10200 copper and is silver plated with gold and nickel under plate.

17. The circuit of claim 1 wherein the lower terminal is fabricated from C10100 copper or C10200 copper and is silver plated with gold and nickel under plate.

18. The circuit of claim 1 wherein the diode is sealed in a borosilicate glass material.

19. The circuit of claim 1 wherein the diode is sealed in a zinc borosilicate glass material.

20. A circuit, comprising:
a diode;
a conductive upper support disposed on top of the diode and electrically coupled to the diode;
a conductive lower support disposed underneath the diode and electrically coupled to the diode;
a mechanical support disposed adjacent to the diode, the conductive upper support and the conductive lower support, wherein the mechanical support is fabricated from C10100 copper or C10200 copper;
an insulator disposed underneath the mechanical support;
an upper terminal coupled to the mechanical support and electrically coupled to the conductive upper support; and
a lower terminal coupled to the insulator and electrically coupled to the conductive lower support.

* * * * *